United States Patent
Henderson et al.

(10) Patent No.: US 9,231,088 B2
(45) Date of Patent: Jan. 5, 2016

(54) EMITTER CONTACT EPITAXIAL STRUCTURE AND OHMIC CONTACT FORMATION FOR HETEROJUNCTION BIPOLAR TRANSISTOR

(71) Applicant: TriQuint Semiconductor, Inc., Hillsboro, OR (US)

(72) Inventors: Timothy S. Henderson, Portland, OR (US); Sheila K. Hurtt, Portland, OR (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 0 days.

(21) Appl. No.: 14/157,096

(22) Filed: Jan. 16, 2014

(65) Prior Publication Data

US 2015/0200284 A1   Jul. 16, 2015

(51) Int. Cl.
*H01L 29/66* (2006.01)
*H01L 29/737* (2006.01)

(52) U.S. Cl.
CPC ........ *H01L 29/737* (2013.01); *H01L 29/66242* (2013.01)

(58) Field of Classification Search
CPC .. H01L 29/70; H01L 29/66242; H01L 29/737
USPC .................................................. 257/192, 565
See application file for complete search history.

(56) References Cited

U.S. PATENT DOCUMENTS

2006/0237743 A1* 10/2006 Miyajima et al. ............. 257/183
2007/0158685 A1*  7/2007 Moriya ......................... 257/192

OTHER PUBLICATIONS

Chen, Kevin J., et al.; "High-Performance InP-Based Enhancement-Mode HEMTs Using Non-Alloyed Ohmic Contacts and Pt-Based Buried-Gate Technologies;" IEEE Transactions on Electron Devices, vol. 43, No. 2, Feb. 1996.
Gosele, U.; "Fast Diffusion in Semiconductor;" Annual Review of Materials Science; vol. 18: 257-282; 1988.
Hsieh, Li-Zen, et al.; "Comparative analysis of platinum diffusion parameters in GaAs and GaN semiconductors," Journal of Applied Physics 102, 024507; 2007.
Ivey, D.G.; "Platinum Metals in Ohmic Contacts to III-V Semiconductors;" Department of Chemical and Materials Engineering, University of Alberta, Canada; Platinum Metals Rev., 43, (1); 1999.
Kang, W.P., et al.; "Comparison and analysis of Pd- and Pt-GaAs Schottky diodes for hydrogen detection," Journal of Applied Physics 75, pp. 8175-8181; Jun. 15, 1994.
Kim, Seiyon, et al.; "Measurements of thermally induced nanometer-scale diffusion depth of Pt/Ti/Pt/Au gate metallization on InAlAs/InGaAs high-electron-mobility transistors;" Applied Physics Letters 87, 232102; Micro and Nanotechnology Laboratory and Department of Electrical and Computer Engineering, University of Illinois, Urbana, Illinois; 2005.

(Continued)

*Primary Examiner* — Mark Tornow
(74) *Attorney, Agent, or Firm* — Withrow & Terranova, P.L.L.C.

(57) ABSTRACT

Embodiments of the present disclosure describe apparatuses, methods, and systems of an integrated circuit (IC) device. The IC device includes a diffusion control layer as part of an emitter epitaxial structure. The IC device may utilize a common metallization scheme to simultaneously form an emitter contact and a base contact. Other embodiments may also be described and/or claimed.

12 Claims, 6 Drawing Sheets

(56) References Cited

OTHER PUBLICATIONS

Ko, Dae-Hong, et al.; "Amorphous phase formation and initial interfacial reactions in the platinum/GaAs system," Journal of Applied Physics, vol. 72, Issue 5, pp. 2036-2042; 1992.

Mahajan, Aaditya, et al.; "Enhancement-Mode High Electron Mobility Transistors (E-HEMT's) Lattice-Matched to InP;" IEEE Transactions on Electron Devices, vol. 45, No. 12, Dec. 1998.

Szerling, Anna, et al.; "Low-resistance p-type ohmic contacts for high-power InGaAs/GaAs-980 nm CW semiconductor lasers," Vacuum, vol. 82, Issue 10, 3, pp. 977-981; 2008.

* cited by examiner

EMITTER CONTACT EPITAXIAL STRUCTURE AND OHMIC CONTACT FORMATION FOR HETEROJUNCTION BIPOLAR TRANSISTOR

FIELD

Embodiments of the present disclosure generally relate to the field of integrated circuits and heterojunction bipolar transistors, and more particularly, to emitter contact epitaxial structures and ohmic contact formation for heterojunction bipolar transistors.

BACKGROUND

Heterojunction bipolar transistors (HBTs) generally utilize ohmic contacts between emitter and/or base contacts and underlying epitaxial layers. Preferably, these ohmic contacts exhibit low resistance and significant thermal stability. For emitter contacts in gallium arsenide (GaAs) based HBTs, low resistance may be achieved by ensuring sufficient contact between the contact metal and an n+ indium gallium arsenide (InGaAs) layer. Thermal stability may be improved by controlling and/or limiting diffusion of the contact metal into the semiconductor epitaxial structure.

Traditionally it has been necessary to utilize different metallization schemes for emitter contacts, as compared to base contacts, to achieve low resistance and thermal stability for both types of contacts. This may require separate processing operations to form emitter contacts and base contacts.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide epitaxial structures for an integrated circuit (IC) device such as, for example, a gallium arsenide (GaAs) based heterojunction bipolar transistor (HBT), methods of fabrication, and systems.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer," may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

Figure 1:
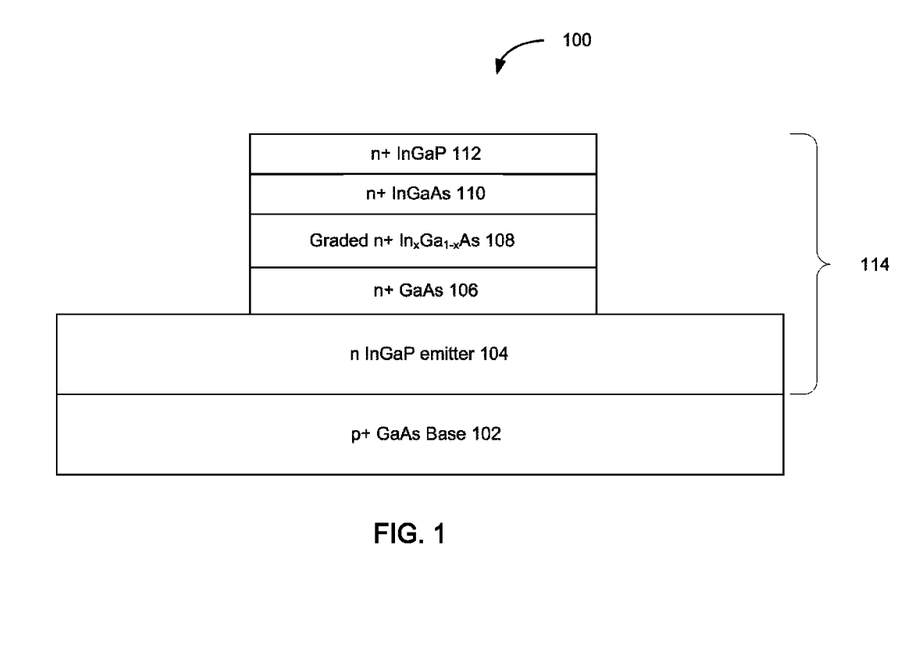
FIG. 1 schematically illustrates an epitaxial structure according to various embodiments.

FIG. 1 schematically illustrates an epitaxial structure that is a portion of an IC device 100, according to various embodiments. The IC device 100 may be, for example, a HBT device.

The IC device 100 may be fabricated on a substrate (not shown), such as a GaAs substrate. The IC device 100 may include additional structures or layers, including but not limited to, collectors, subcollectors, and/or buffer layers. Only layers associated with an emitter stack 114 and an underlying base layer 102 are shown for clarity. Impurities may be added to materials used to form various layers to modify their electrical properties. This is known as doping and can create an excess of electrons (n type doping) or electron holes (p type doping). The letters "n" and "p" are used to indicate moderately doped materials while "n+" and "p+" are used to indicate highly doped materials. The IC device 100 may include a p+ GaAs base layer 102 that may be epitaxially deposited on a substrate or other layer. An emitter stack 114 may be formed on the p+ GaAs base layer 102.

The emitter stack 114 formed on the p+ GaAs base layer 102 may include epitaxially deposited layers of different material systems that form one or more heterojunctions/heterostructures. The layers of the emitter stack 114 may be formed in situ. That is, the emitter stack 114 may be formed on the p+ GaAs base layer 102 in manufacturing equipment (e.g., a chamber) where the constituent layers of the emitter stack 114 are formed (e.g., epitaxially grown) without removing the p+ GaAs base layer 102, or a related substrate, from the manufacturing equipment. The p+ GaAs base layer 102 may be formed on a substrate or other layer by similar techniques prior to formation of the emitter stack 114. The p+ GaAs base layer 102 may have a thickness between 500 and 1200 angstroms. As used herein, a thickness of a layer refers to a dimension of the layer in a direction that is substantially perpendicular to a major surface of the p+ GaAs base layer 102 (seen as vertical height in FIG. 1). While a p+ GaAs base layer 102 is shown, other base layer materials may be used.

In some embodiments, the emitter stack 114 of the IC device 100 may include an n indium gallium phosphide (InGaP) emitter layer 104. The n InGaP emitter layer 104 may have a 50% mole fraction of indium to gallium and thus may be designated as $In_{0.5}Ga_{0.5}P$. The n InGaP emitter layer 104 may have a thickness between 300 and 500 angstroms.

In some embodiments, the emitter stack 114 of the IC device 100 may include an n+ GaAs layer 106. The n+ GaAs layer 106 may be formed on the n InGaP emitter layer 104. The n+ GaAs layer 106 may have a thickness of 500 angstroms or more.

In some embodiments, the emitter stack 114 of the IC device 100 may include a graded n+ indium gallium arsenide (InGaAs) layer 108. The graded n+ InGaAs layer 108 may be formed on the n+ GaAs layer 106. The graded n+ InGaAs layer 108 may have a thickness between 100 and 1000 angstroms. The graded n+ InGaAs layer 108 may have a structure of $In_xGa_{1-x}As$ where x varies from 0 to 0.5 or more over the thickness of the graded n+ InGaAs layer 108 such that x=0 adjacent the n+ GaAs layer 106 and x=0.5 adjacent the n+ InGaAs layer 110. For instance, x may vary from x=0 adjacent the n+ GaAs layer to a value between 0.4 and 0.7 adjacent the n+ InGaAs layer 110. This may provide a structural transition from n+ GaAs layer 106 to the n+ InGaAs layer 110.

In some embodiments, the emitter stack 114 of the IC device 100 may include an n+ indium gallium arsenide (InGaAs) layer 110. The n+ InGaAs layer 110 may be formed on the graded n+ InGaAs layer 108. The n+ InGaAs layer 110 may have a thickness between 100 and 1000 angstroms. The n+ InGaAs layer 110 may have a 50% mole fraction of indium to gallium and thus may be designated as $In_{0.5}Ga_{0.5}As$.

In typical GaAs HBTs, an emitter contact may be formed directly on the n+ InGaAs layer 110. This is generally accomplished in one of two ways. The first utilizes a refractory metal contact such as titanium tungsten (TiW) or tungsten silicon (WSi) in contact with the n+ InGaAs layer 110 onto which metal layers, such as titanium/platinum/gold (Ti/Pt/Au) layering, are added. The other typical emitter contact formation technique may utilize a shallow alloyed contact. This may include the formation of metal layers of Ti/Pt/Au or platinum/titanium/platinum/gold Pt/Ti/Pt/Au directly on the n+ InGaAs layer 110. Unlike metallization schemes used to form base contacts, which are discussed later, the Ti layer or first Pt layer of an emitter contact must be shallow, generally on the order 50 angstroms, to prevent unwanted diffusion. Thicker first metal layers, such as those associated with base contact metallization schemes, may result in diffusion of the Ti or Pt beyond the n+ InGaAs layer 110. Such increased diffusion may result in one, or both, of increased resistance and/or decreased thermal stability. As such, typical techniques may require separate processing operations to form the emitter contact structure and the base contact structure. Emitter stacks according to the present disclosure may allow the same metallization scheme, typically associated with forming base contacts, to be used to simultaneously form both emitter and base contacts. This may result in decreased cost and time associated with manufacturing by reducing the overall number of required processing operations.

In some embodiments, the emitter stack 114 of the IC device 100 may include an n+ InGaP layer 112. The n+ InGaP layer 112 may be formed on the n+InGaAs layer 110. The n+ InGaP layer 112 may serve as a diffusion control layer to control Pt, or other metal, diffusion during formation of an emitter contact structure as discussed in more detail below. The n+ InGaP layer 112 may have a thickness between 300 and 500 angstroms. Similar to the n InGaP emitter layer 104, the n+InGaP layer 112 may have a 50% mole fraction of indium to gallium and thus may be designated as $In_{0.5}Ga_{0.5}P$. In some embodiments, the n+ InGaP layer 112 may have a thickness that is substantially equal to the n InGaP emitter layer 104. In this manner the n+ InGaP layer 112 may provide the same natural limitation to metal diffusion, such as Pt diffusion, as the n InGaP emitter layer 104 thus allowing for a thicker metal layer, such as a first Pt layer, to be utilized when forming an emitter contact without unwanted metal diffusion beyond the n+ InGaAs layer 110. This is discussed in more detail below with reference to FIG. 3. While shown as InGaP, other materials may be used to achieve similar diffusion control. For instance, instead of InGaP, a layer of GaAs, indium phosphide (InP), indium aluminum arsenide (InAlAs), aluminum gallium arsenide (AlGaAs) or other III-V materials may be used to provide a diffusion controlling layer similar to n+ InGaP layer 112. It may also be possible to increase the thickness of the n+ InGaAs layer 110 to prevent metal from diffusing into the graded n+ GaAs layer 108 or the n+ GaAs layer 106, which may result in higher emitter contact resistance.

Figure 2:
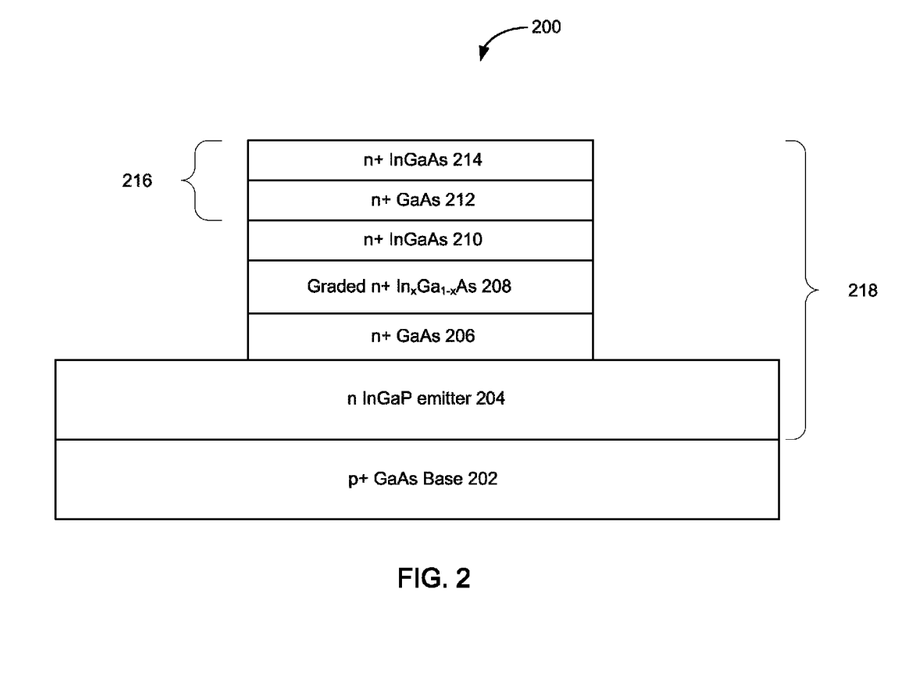
FIG. 2 schematically illustrates an epitaxial structure including a super lattice according to various embodiments.

FIG. 2 schematically illustrates an epitaxial structure that is a portion of an IC device 200, according to various embodiments. The IC device 200 may be, for example, a HBT device. The IC device 200 may be similar to the IC device 100, discussed above with regard to FIG. 1, with the exception that instead of a single diffusion control layer, such as n+ InGaP layer 112, a super lattice structure may be used to control metal diffusion.

The IC device 200 may be fabricated on a substrate (not shown), such as a GaAs substrate. The IC device 200 may include additional structures or layers, including but not limited to, collectors, subcollectors, and/or buffer layers. Only layers associated with an emitter stack 218 and an underlying base layer 202 are shown for clarity. The IC device 200 may include a p+ GaAs base layer 202 that may be epitaxially deposited on a substrate or other layer. An emitter stack 218 may be formed on the p+ GaAs base layer 202. The p+ GaAs base layer 202 may be substantially similar to the p+ GaAs base layer 102 discussed above with reference to FIG. 1.

In some embodiments, the IC device 200 may include an emitter stack 218 that is similar to emitter stack 114, discussed previously with reference to FIG. 1. For instance, emitter stack 218 may include an n InGaP emitter layer 204, which may be substantially similar to the n InGaP emitter layer 104 discussed previously with reference to FIG. 1. Emitter stack 218 may also include an n+ GaAs layer 206, which may be substantially similar to the n+ GaAs layer 106 discussed previously with reference to FIG. 1. Emitter stack 218 may also include a graded n+ InGaAs layer 208, which may be substantially similar to the graded n+ InGaAs layer 108 discussed previously with reference to FIG. 1. Emitter stack 218 may further include an n+ InGaAs layer 210, which may be substantially similar to the n+ InGaAs layer 110 discussed previously with reference to FIG. 1. Each of the layers 202-210 may be substantially similar to its counterpart as discussed above regarding FIG. 1 and may have dimensions and structures as discussed previously.

In some embodiments, the IC device 200 may include a super lattice structure 216 to control metal diffusion. The super lattice 216 may be made up of alternating layers of a first material and a second material. For instance, the super lattice 216 may include one or more n+ GaAs layers 212, with one or more intervening n+ InGaAs layers 214. The super lattice 216 may serve as a diffusion control layer, similar to the n+ InGaP layer 112 discussed above. Although shown as a single n+GaAs layer 212 and a single n+ InGaAs layer 214, any number of alternating layers may be included in the IC device 200. In one embodiment, the super lattice 216 may include four periods where each period may contain an n+ GaAs layer 212 and an n+ InGaAs layer 214, each having a thickness of approximately 50 angstroms. In this arrangement the super lattice 216 would have eight total layers and a thickness of approximately 400 angstroms. Other materials and other quantities and thicknesses of layers may be used. For instance in some embodiments the n+ GaAs layer/s 212 may be replaced by n+ layers of InP, InAlAs, InGaP, AlGaAs, or other III-V materials. Layer quantity and thickness may be adjusted to prevent Pt deposited during the metallization process from diffusing beyond the n+ InGaAs layer 210. Maintaining a Pt diffusion front in the n+ InGaAs layer 210 is desirable as it may result in decreased resistance and increased thermal stability for an emitter contact.

Figure 3:
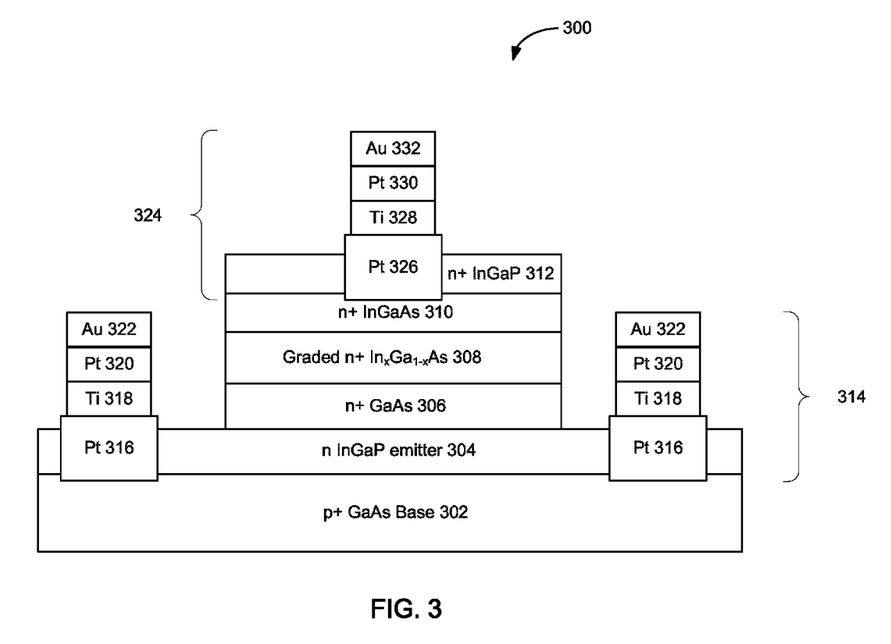
FIG. 3 schematically illustrates a portion of a heterojunction bipolar transistor according to various embodiments.

FIG. 3 schematically illustrates an IC device 300, according to various embodiments. The IC device 300 may be, for example, a HBT device. The IC device 300 may include a series of layers similar to those discussed relative to the IC device 100, of FIG. 1. Although shown in the context of the layer structure from FIG. 1 the concepts of FIG. 3 apply equally to the super lattice arrangements of FIG. 2.

The IC device 300 may include a series of layers 302-312; these layers may correspond to the layers 102-112 of FIG. 1 and may have similar structures and thicknesses to layers 102-112 of FIG. 1. The IC device 300 may also include one or more base contacts 314 and one or more emitter contacts 324. Each of the base contacts 314 and emitter contacts 324 may be formed simultaneously through a single metallization process. As such base contacts 314 and emitter contacts 324 may have the same series of metal layers.

The base contact 314 may include a first Pt layer 316. The first Pt layer 316 may be formed on the n InGaP emitter layer 304 such that it diffuses through the n InGaP emitter layer 304 and makes contact with the p+ GaAs base layer 302. A Ti layer 318 may be formed on the first Pt layer 316. A second Pt layer 320 may be formed on the Ti layer 318. The Ti layer 318 may prevent diffusion of the second Pt layer 320 into the first Pt layer 316. An Au layer 322 may be formed on the second Pt layer 320. This Pt/Ti/Pt/Au metallization scheme may provide a low resistance contact with sufficient thermal stability. As discussed previously, the Pt/Ti/Pt/Au metallization scheme used for base contacts is not traditionally used to form emitter contacts because a shallower bottom layer of Ti or Pt is necessary due to issues associated with excess Pt diffusion resulting in unacceptably high resistance and/or low thermal stability. Thus, even though the same series of layers may have been used, different fabrication operations may have been necessary to form layers of differing thickness for the emitter contact relative to the base contact. The addition of the n+ InGaP layer 312, or other alternatives, such as the super lattice 216 of FIG. 2 as well as other materials discussed previously, allows the same Pt/Ti/Pt/Au metallization scheme to be used to form emitter contacts 324 simultaneously with the formation of base contacts 314.

The emitter contact 324 may include a first Pt layer 326. The first PT layer 326 may be formed on the n+ InGaP layer 312 and may diffuse through the n+ InGaP layer 312 to make contact with the n+ InGaAs layer 310. Controlling diffusion such that the Pt diffusion front is located in the n+ InGaAs layer 310 may result in a low resistance contact with high thermal stability as desired. As discussed previously, in some embodiments the n+ InGaP layer 312 may be have a thickness approximately equal to the thickness of the n InGaP emitter layer 304. In these embodiments, the diffusion of the first Pt layer 316 of the base contact 314 may be approximately equal to the diffusion of the first Pt layer 326 of the emitter contact 324.

The emitter contact 324 may further include a Ti layer 328 formed on the first Pt layer 326. The emitter contact 324 may also include a second Pt layer 330 formed on the Ti layer 328, as well as an Au layer 332 formed on the second Pt layer 330. The layers 326-332 of the emitter contact 324 may be formed though the same metallization process that forms layers 316-322 of the base contact 324. The use of a common metallization process to form both the emitter contacts 324 and base contacts 314 may reduce the number of fabrication operations, by eliminating separate emitter contact fabrication operations, saving time and/or money.

Figure 4:
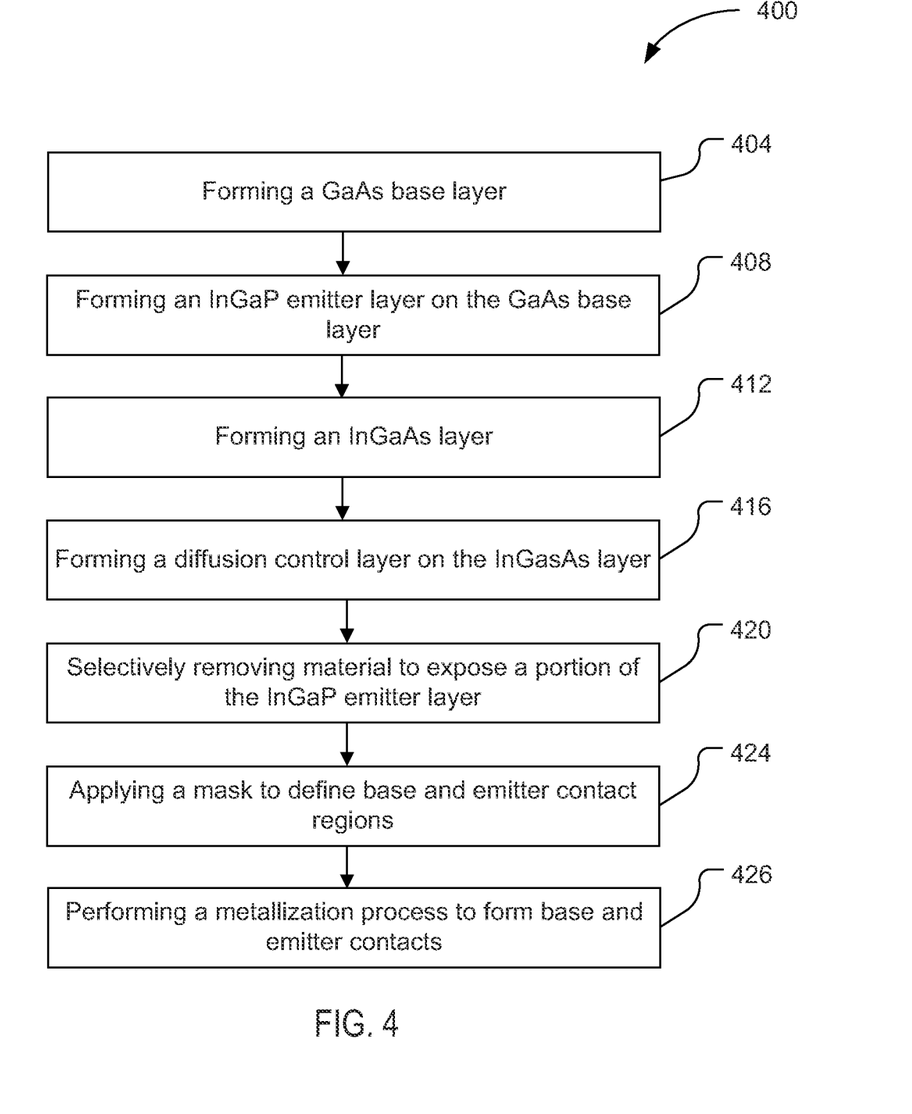
FIG. 4 is a flow diagram of a method for fabricating an integrated circuit device according to various embodiments.

FIG. 4 shows a flow diagram of a method 400 for fabricating an IC device, such as IC device 100, 200 or 300, according to various embodiments.

The method 400 begins at 404 with forming a GaAs base layer. This may include forming a p+ GaAs base layer such as 102, 202, or 302 from FIGS. 1-3. Any suitable technique, including but not limited to, epitaxial deposition by molecular beam epitaxy (MBE), atomic layer epitaxy (ALE), chemical beam epitaxy (CBE) and/or metal-organic chemical vapor deposition (MOCVD), may be utilized to form the various layers discussed in reference to method 400.

The method 400 may continue at 408 with forming an InGaP emitter layer on the GaAs base layer. This may include forming an n InGaP emitter layer such as 104, 204 or 304 of FIGS. 1-3.

The method 400 may include, at 412, forming an InGaAs layer. This may include forming an n+ InGaAs layer such as 110, 210 or 310 of FIGS. 1-3. Other operations may be part of the fabrication process, but are not specifically discussed with regard to method 400 for clarity. For instance the fabrication process may include the formation of additional layers including n+ GaAs layers (such as 106, 206 or 306), graded n+ InGaAs layers (such as 108, 208 or 308) as well as collector, subcollector, or buffer layers.

The method 400 may include, at 416, forming a diffusion control layer on the InGaAs layer. This may include forming an n+ InGaP layer such as 112 or 312 of FIGS. 1 and 3, or a super lattice 216 as discussed with reference to FIG. 2.

The method 400 may include, at 420, selectively removing material to expose a portion of the InGaP emitter layer. This may include an etching operation (known as emitter mesa etch) or other suitable material removal techniques. This may also include a patterning or masking operation, such as a photolithography operation, to allow the InGaP emitter layer to be exposed in some regions and not exposed in others. This operation may remove one or more layers of the emitter stack, such as 114 or 218, to prepare the structure for the formation of a base contact such as 314.

The method 400 may include, at 424, applying a mask to define base and emitter contact regions. This may include defining one or more base contact regions on the exposed portion of the InGaP emitter layer and defining one or more emitter contact regions on the diffusion control layer. Any suitable masking technique may be utilized to perform this operation.

The method 400 may include, at 426, performing a metallization process to form base and emitter contacts. This operation may be performed using any suitable technique including a metal sputtering or evaporation operation. This may include the formation of one or more metal layers and may correspond to the formation of the base contacts 314 and emitter contacts 324 discussed with reference to FIG. 3. In some embodiments, this may include the formation of first Pt layer, a Ti layer, a second Pt layer, and an Au layer. A single metallization process, such as a Pt/Ti/Pt/Au scheme may be used to simultaneously form both base and emitter contacts.

Figure 5:
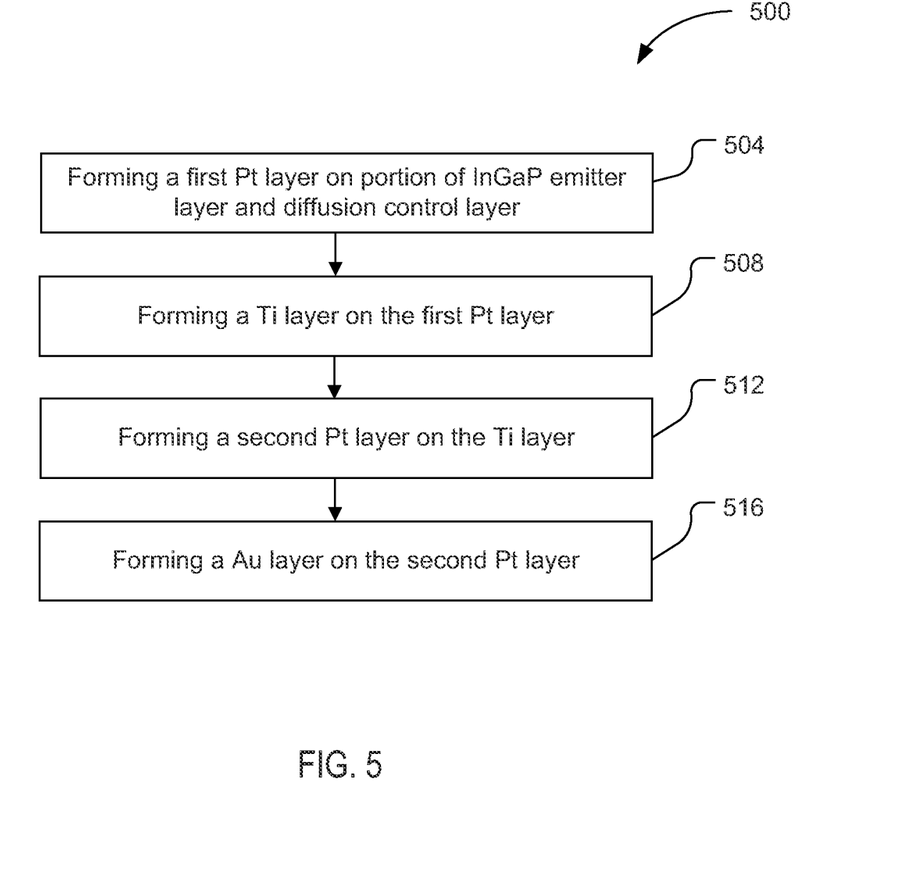
FIG. 5 is a flow diagram of a method for fabricating contacts of an integrated circuit device according to various embodiments.

FIG. 5 shows a flow diagram of a method 500 for performing a metallization process to form base and emitter contacts, such as 314 and 324 in FIG. 3. The method 500 may correspond to the metallization process discussed above in conjunction with operation 426 of method 400.

The method 500 begins at 504 with the formation of a first Pt layer on a portion of an InGaP emitter layer and on a portion of a diffusion control layer. This may include forming the first Pt layer 316 and 326 of FIG. 3. The portion of the first Pt layer formed on the InGaP emitter layer may be associated with a base contact (such as 314), while the portion of the first Pt layer formed on the diffusion control layer may be associated with an emitter contact (such as 324). Any suitable technique, including a sputtering operation, may be used for each of 504, 508, 512 and 516.

The method 500 may continue at 508 with the formation of a Ti layer on the first Pt layer. This may include forming the Ti layer 318 and 328 of FIG. 3. The Ti layer may serve to prevent diffusion of the second Pt layer discussed below.

The method 500 may further include, at 512, the formation of second Pt layer on the Ti layer. This may include forming the second Pt layer 320 and 330 of FIG. 3.

The method 500 may also include, at 516, the formation of an Au layer on the second Pt layer. This may include forming the Au layer 322 and 332 of FIG. 3.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 6:
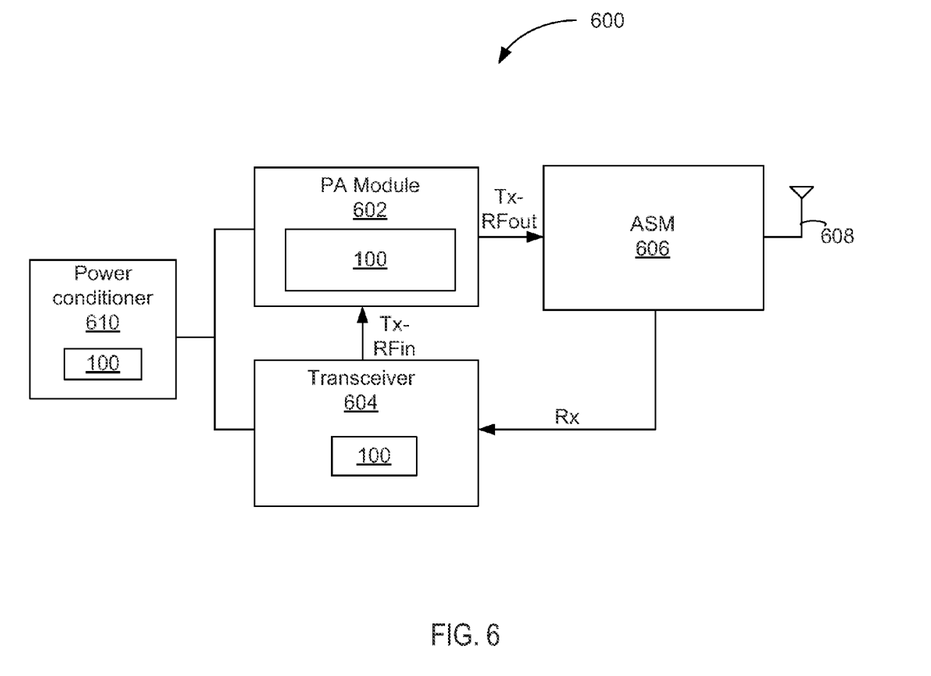
FIG. 6 schematically illustrates an example system including an IC device according to various embodiments.

An IC device, for example, the IC device 100, 200, or 300, may be incorporated into various apparatuses and systems. Although shown as 100 throughout FIG. 6 any IC device consistent with the techniques described herein, including but not limited to, IC devices 200 and/or 300 may be substituted for IC device 100. A block diagram of an example system 600 is illustrated in FIG. 6. As illustrated, the system 600 includes a power amplifier (PA) module 602, which may be a Radio Frequency (RF) PA module in some embodiments. The system 600 may include a transceiver 604 coupled with the power amplifier module 602 as illustrated. The power amplifier module 602 may include an IC device, for example, the IC device 100 described herein.

The power amplifier module 602 may receive an RF input signal, RFin, from the transceiver 604. The power amplifier module 602 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 6.

The amplified RF output signal, RFout, may be provided to an antenna switch module (ASM) 606, which effectuates an over-the-air (OTA) transmission of the RF output signal, RFout, via an antenna structure 608. The ASM 606 may also receive RF signals via the antenna structure 608 and couple the received RF signals, Rx, to the transceiver 604 along a receive chain. In some embodiments, the transceiver 604 may additionally/alternatively include the IC device 100 in, for example, a low-noise amplifier.

In various embodiments, the antenna structure 608 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

In some embodiments, the system 600 may include a power conditioner 610 that additionally/alternatively includes an IC device, such as the IC device 100. The power conditioner 610 may be coupled with, and provide power to, various components of the system 600 such as, but not limited to, PA module 602 and transceiver 604. In these embodiments, the IC device 100 may provide an effective switch device for power-switch applications including power conditioning applications such as, for example, Alternating Current (AC)-Direct Current (DC) converters, DC-DC converters, DC-AC converters, and the like.

In various embodiments, the system 600 may be particularly useful for power amplification at high radio frequency power and frequency. For example, the system 600 may be suitable for any one or more of terrestrial and satellite communications, radar systems, and possibly in various industrial and medical applications. More specifically, in various embodiments, the system 600 may be a selected one of a radar device, a satellite communication device, a mobile handset, a cellular telephone base station, a broadcast radio, or a television amplifier system.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
    a gallium arsenide (GaAs) base layer;
    an indium gallium phosphide (InGaP) emitter layer formed on the GaAs base layer;
    an emitter epitaxial structure formed on the InGaP emitter layer, including:
        an indium gallium arsenide (InGaAs) layer; and
        a diffusion control layer formed on the InGaAs layer;
    a base contact coupled with at least one of the GaAs base layer or the InGaP emitter layer; and
    an emitter contact coupled with the diffusion control layer, wherein the diffusion control layer comprises a super lattice structure having alternating layers of a first material and a second material.

2. The apparatus of claim 1, wherein the base contact and the emitter contact have a common metallization structure.

3. The apparatus of claim 2, wherein the common metallization structure comprises:
    a first platinum (Pt) layer;
    a titanium (Ti) layer formed on the first Pt layer;
    a second Pt layer formed the on the Ti layer; and
    a gold (Au) layer formed on the second Pt layer.

4. The apparatus of claim 3, wherein the first Pt layer of the emitter contact extends through the diffusion control layer and partially into the InGaAs layer.

5. The apparatus of claim 1, wherein the diffusion control layer comprises at least one of InGaP, GaAs, indium phosphide (InP), indium aluminum arsenide (InAlAs), aluminum gallium arsenide (AlGaAs), or InGaAs.

6. The apparatus of claim 5, wherein the diffusion control layer is an InGaP layer having a thickness of approximately 300 to 500 angstroms.

7. The apparatus of claim 5, wherein the diffusion control layer is an InGaP layer having a thickness approximately equal to a thickness of the InGaP emitter layer.

8. The apparatus of claim 1, wherein the first material is InGaAs and the second material is one of GaAs, indium phosphide (InP), indium aluminum arsenide (InAlAs), InGaP or aluminum gallium arsenide (AlGaAs).

9. The apparatus of claim 1, wherein the super lattice structure contains at least three periods, each period comprising a layer of the first material having a thickness of between approximately 20-100 angstroms and a layer of the second material having a thickness of between approximately 20-100 angstroms.

10. The apparatus of claim 1, wherein the emitter epitaxial structure further comprises:
a GaAs layer formed on the InGaP emitter layer; and
a graded InGaAs layer formed on the GaAs layer,
wherein the InGaAs layer is formed on the graded InGaAs layer.

11. A system comprising:
a transceiver to transmit and receive radio frequency (RF) signals; and
a heterojunction bipolar transistor (HBT) incorporated within or coupled with the transceiver, the HBT including:
a gallium arsenide (GaAs) base layer;
an indium gallium phosphide (InGaP) emitter layer formed on the GaAs base layer;
an emitter epitaxial structure formed on the InGaP emitter layer, comprising:
an indium gallium arsenide (InGaAs) layer; and
a diffusion control layer formed on the InGaAs layer;
a base contact coupled with at least one of the GaAs base layer or the InGaP emitter layer; and
an emitter contact coupled with diffusion control layer, wherein the diffusion control layer comprises a super lattice structure having alternating layers of a first material and a second material.

12. The system of claim 11, further comprising at least one of a power amplifier or a power condition, wherein the at least one of a power amplifier or a power condition includes the HBT.

* * * * *